United States Patent [19]

Nakamae

[11] Patent Number: 4,800,177
[45] Date of Patent: Jan. 24, 1989

[54] SEMICONDUCTOR DEVICE HAVING MULTILAYER SILICIDE CONTACT SYSTEM AND PROCESS OF FABRICATION THEREOF

[75] Inventor: Masahiko Nakamae, Tokyo, Japan
[73] Assignee: NEC Corporation, Japan
[21] Appl. No.: 840,317
[22] Filed: Mar. 14, 1986
[30] Foreign Application Priority Data Mar. 14, 1985 [JP] Japan ................. 60-50911

[51] Int. Cl.[4] .................. H01L 21/283; H01L 21/225
[52] U.S. Cl. ................... 437/193; 437/162; 437/192; 437/200; 148/DIG. 124; 148/DIG. 147
[58] Field of Search ............... 437/200, 201, 192–195, 437/162; 357/67, 71

[56] References Cited

U.S. PATENT DOCUMENTS

3,753,774  8/1973  Veloric ........................... 437/192
3,900,944  8/1975  Fuller et al. .................... 437/192
4,141,022  2/1979  Sigg et al. ....................... 437/192
4,436,582  3/1984  Saxena ........................... 437/192

Primary Examiner—Brian E. Hearn
Assistant Examiner—T. N. Quach
Attorney, Agent, or Firm—Laff, Whitesel, Conte & Saret

[57] ABSTRACT

A process for making a semiconductor device including a semiconductor layer heavily doped to a predetermined dopant concentration and a multilayer contact system in contact with a surface portion of the heavily doped semiconductor layer, the multilayer contact system comprising a metal silicide layer of the silicide of a refractory metal, the metal silicide layer directly contacting the surface portion of the heavily doped semiconductor layer and being lower in dopant concentration than the predetermined dopant concentration of the semiconductor layer, a barrier layer of at least one metal on the metal silicide layer, and an electrode layer including a highly conductive metal on the barrier layer.

4 Claims, 5 Drawing Sheets

SEMICONDUCTOR DEVICE HAVING MULTILAYER SILICIDE CONTACT SYSTEM AND PROCESS OF FABRICATION THEREOF

FIELD OF THE INVENTION

The present invention relates in general to semiconductor devices and, in particular, to a semiconductor device having a multilayer contact system and to a process of fabricating such a semiconductor device.

BACKGROUND OF THE INVENTION

A semiconductor device having a multilayer contact system typically includes a layer of a refractory metal silicide directly deposited on the surface of a monosilicon or polysilicon layer, a barrier layer of a refractory metal formed on the silicide layer, and a major or wiring electrode layer of, typically, aluminum. The metal silicide layer on the monosilicon or polysilicon layer is formed by depositing a high melting-point metal, viz., refractory metal such as platinum on the surface of the monosilicon or polysilicon layer and heating the metal to cause it to react with the monosilicon or polysilicon for forming the layer of the metal silicide on the monosilicon or polysilicon layer. The metal silicide has an electric resistance lower by tenths of a factor than that of polysilicon and is thus used to provide a low interconnection resistance without creating a p-n junction between the silicide layer and the underlying active region of the monosilicon or polysilicon layer. On the other hand, the barrier layer covering this silicide layer is used to prevent the topmost wiring electrode layer of aluminum from reacting with the metal silicide of the layer underlying the barrier layer. Silicon dissolves into aluminum during any subsequent high-temperature steps of the device fabrication process because of the relatively high solid solubility of silicon into aluminum at temperatures ordinarily used to form the aluminum layer on the titanium-tungsten layer. Thus, aluminum may propagate into the silicon substrate and thereby form pits or spikes of aluminum in the substrate. The aluminum spikes will penetrate through the p-n junction in the silicon substrate and will accordingly destroy the p-n junction. The barrier layer of the titanium-tungsten alloy is intended to prevent the device from being caused to fail by the destruction of the p-n junction due to formation of the aluminum spikes.

Figure 1:
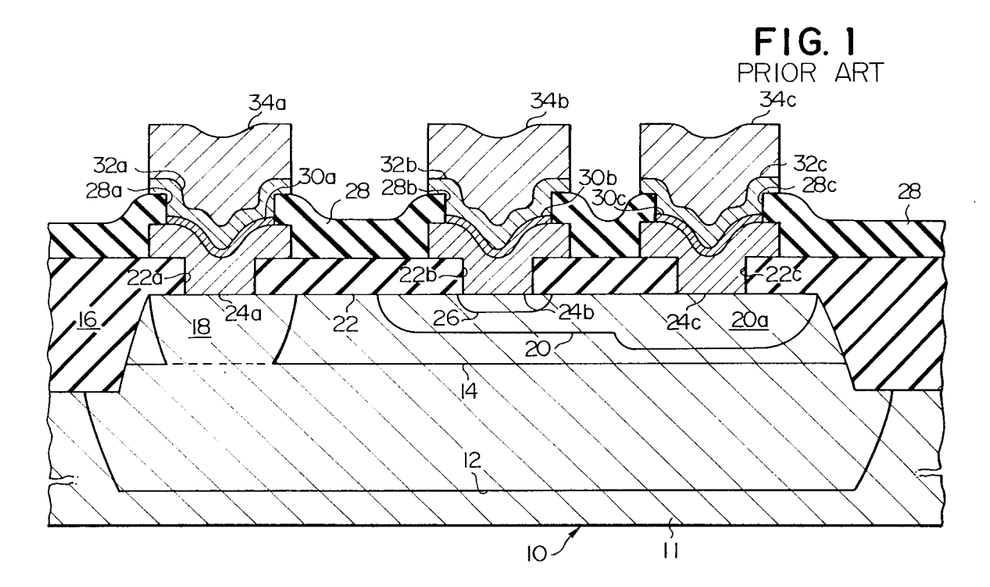
FIG. 1 is a fragmentary cross sectional view showing an example of a prior-art semiconductor device having a three-layer contact system of the nature to which the present invention appertains.

A well known example of a semiconductor device having a multilayer contact system uses platinum silicide (PtSi) as the refractory metal silicide layer and a titanium-tungsten alloy (Ti-W) as the barrier layer underlying the topmost aluminum layer. FIG. 1 of the drawings schematically shows the complete structure of a semiconductor device having such a three-level Al/Ti-W/PtSi contact system.

The prior-art semiconductor device illustrated in FIG. 1 includes a substrate 10 including a body portion 11 of p+-type silicon which has a selected portion heavily doped with an n-type dopant such as arsenic or antimony to form a buried n+-type diffusion region 12. On the resultant body portion 11 of the substrate 10 is epitaxially grown an n-type layer 14 which in part covers the n+-type diffusion region 12. The substrate 10 thus includes the p-type silicon body portion 11, buried n+-type diffusion region 12 and n-type epitaxial layer 14. The n-type epitaxial layer 14 is selectively oxidized with use of a mask of, for example, silicon nitride to form an isolation oxide layer 16 which is partially embedded in the silicon substrate 10. Into one selected portion of the island of the n-type epitaxial layer 14 which is thus isolated by the isolation oxide layer 16 is doped an n-type dopant such as arsenic or phosphorus typically by ion implantation techniques to form an n+-type collector contact region 18 homogeneous with the buried n+-type diffusion region 12. Into another selected portion of the island of the epitaxial layer 14 is heavily doped a p-type dopant such as boron to form a p-type base region 20 also typically by ion implantation techniques. A p-type dopant such as boron may be further introduced into a selected portion of this p-type base region 20 to form a heavily doped graft base area 20a having a reduced resistivity. On the entire surface of the resultant structure is formed a relatively thin first protective layer 22 of silicon oxide, which is then patterned and etched to form openings 22a, 22b and 22c. The opening 22a is located over the n+-type collector contact region 18 and the opening 22c is located over the graft base area 20a of the p-type base region 20. The opening 22b is located over another area of the base region 20 as shown.

Polysilicon is then conformally deposited over the entire surface of the resultant structure to form a polysilicon layer in part on the surface of the first protective oxide layer 22 and in part on the silicon substrate 10 through the openings 22a, 22b and 22c in the oxide layer 22. The polysilicon layer is then patterned and etched away to leave regions 24a, 24b and 24c each in part contacting the silicon substrate 10 through each of the openings 22a, 22b and 22c, respectively, in the oxide layer 22 and in part overlying edge portions of the oxide layer 22 along each opening. In this instance, each of the regions 24a, 24b and 24c thus left of the polysilicon layer may have overlaps of about 1 micron with the edge portions of the oxide layer 22 along each of the openings 22a, 22b and 22c in the layer 22. The polysilicon regions 24a and 24b are then doped with an n-type dopant such as arsenic by ion implantation techniques, while the polysilicon region 24c is doped with a p-type dopant such as boron through the opening 22c in the oxide layer 22 also by ion implantation techniques. The entire structure is then heated at, for example, 950° C. to anneal the polysilicon regions 24a, 24b and 24c. This annealing step is used not only to activate the atoms of the dopants implanted into the polysilicon regions 24a, 24b and 24c but to cause the n-type dopant in the polysilicon region 24b to partially diffuse into the p-type base region 20 to form an n-type emitter region 26 within the base region 20. The annealing step further lends itself to providing improved ohmic contact between the collector contact region 18 and the associated polysilicon region 24a, between the emitter region 26 and the associated polysilicon region 24b, and between the graft base area 20a of the base region 20 and the associated polysilicon region 24c. The n+-type collector contact region 18, p-type base region 20 and n-type emitter region 26 as formed in the silicon substrate constitute in combination a semiconductor device in the form of a bipolar transistor.

A second protective layer 28 of silicon oxide is then conformally deposited on the entire surface of the resultant structure and is patterned and etched to form contact openings 28a, 28b and 28c over the doped polysilicon regions 24a, 24b and 24c, respectively. Through these contact openings 28a, 28b and 28c in the second protective oxide layer 28 is formed a multilayer contact system including a layer of platinum silicide as the refractory metal silicide, a barrier layer of titanium-tungsten alloy as the refractory metal, and a topmost wiring electrode layer of aluminum. A layer of platinum is thus deposited on the entire upper surfaces of the doped polysilicon regions 24a, 24b and 24c and the second protective oxide layer 28, whereupon heat treatment is used at 500° C. to form platinum silicide layer regions 30a, 30b and 30c on the exposed upper surfaces of the doped polysilicon regions 24a, 24b and 24c, respectively, within the openings 25a, 25b and 25c, respectively, in the second protective oxide layer 28. The platinum layer remaining on the protective oxide layer 28 is removed before the barrier and wiring electrode layers are to be formed. After the barrier and wiring electrode layers are formed conformally on the surface of the resultant structure, the layers are patterned and etched to leave titanium-tungsten barrier layer regions 32a, 32b and 32c on the platinum silicide layer regions 30a, 30b and 30c, respectively, and wiring electrode layer regions 34a, 34b and 34c of aluminum on the titanium-tungsten barrier layer regions 32a, 32b and 32c, respectively.

Figure 2A:
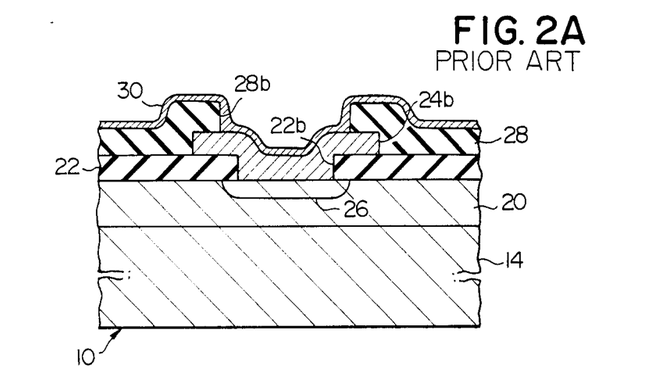
FIGS. 2A to 2C are fragmentary cross sectional views showing some structures formed during the process of fabricating the semiconductor device of FIG. 1.
Figure 2B:
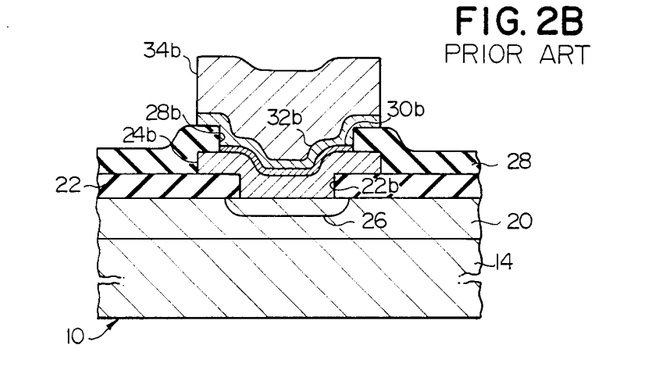
Figure 2C:
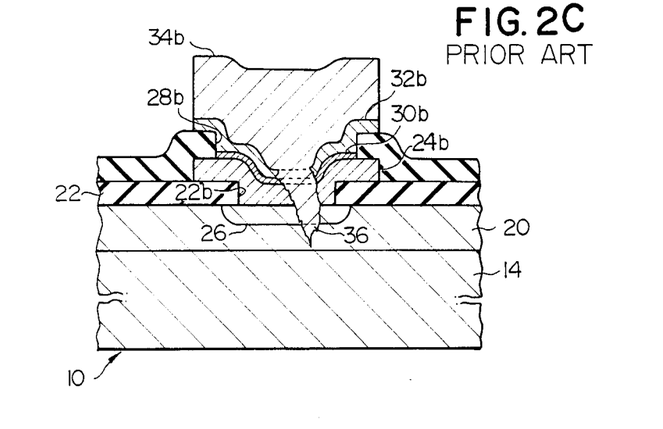

In the prior-art semiconductor device having the multilayer contact systems thus arranged, the electrode stack 30c/32c/34c for the p-type base region 20 of the device remains in a stable state during every subsequent step of the device fabrication and packaging process and further when the device completed is in use. A problem is however encountered by the electrode stacks 30a/32a/34a and 30b/32b/34b for the n-type collector and emitter regions 18 and 26, respectively. The platinum silicide layer regions 30a and 30b of the electrode stacks for the collector and emitter regions 18 and 26 tend to be deficient in thickness and chemical homogeneousness of material and, for this reason, tend to cause contact failures during subsequent process steps or during use of the device. The reasons for this will be hereinafter explained with reference to FIGS. 2A to 2C as well as FIG. 1 of the drawings. In FIGS. 2A to 2C are shown, for simplicity of illustration, only those portions of the device described with reference to FIG. 1 which are associated with the electrode stack for the emitter region 26 of the device.

Referring to FIG. 2A, the silicon substrate 10 has the n-type layer 14 which has been epitaxially grown on the buried n+-type diffusion region 12 (FIG. 1) of the substrate 10. In this n-type epitaxial layer 14 is locally formed the p-type base region 20 which is covered with the first protective layer 22 of silicon oxide formed with the opening 22b allowing the surface of the silicon substrate 10 to partly expose therethrough. Polysilcon is then deposited over the entire surface of the resultant structure to form a conformal polysilicon layer in part on the surface of the first protective oxide layer 22 and in part on the silicon substrate 10 through the opening 22b in the oxide layer 22. The polysilicon layer is then selectively etched away to leave regions including the region 24b in part contacting the silicon substrate 10 through the opening 22b in the oxide layer 22 and in part overlying edge portions of the oxide layer 22 along the opening 22b. As previously noted, the region 24b thus left of the plysilicon layer has overlaps of about 1 micron with the edge portions of the oxide layer 22 along the opening 22b in the layer 22. The polysilicon region 24b is then doped with an n-type dopant such as arsenic through the opening 22b in the oxide layer 22 by ion implantation techniques with a dosage of $1 \times 10^{16}$ atoms/cm$^2$. The entire structure is then heated at, for example, 950° C. for 15 minutes to anneal the polysilicon region 24b, with the result that the n-type dopant in the polysilicon region 24b having a dopant concentration of $1 \times 10^{19}$ atoms/cm$^3$ or more is caused to partially diffuse into the p-type base region 20 to form the shallow n-type emitter region 26 within the base region 20. As previously noted, improved ohmic contact is provided between the emitter region 26 and the associated polysilicon region 24b as a result of this annealing step. The second protective layer 28 of silicon oxide is then conformally deposited on the entire surface of the resultant structure and is patterned and etched to form contact openings including the contact opening 28b allowing the surface of the doped polysilicon region 24b on the emitter region 26 to partly expose. Platinum is deposited by, for example, sputtering onto the entire surface of the structure to form a platinum layer 30 to a thickness of, for example, about 300 Å.

Heat treatment is then used to cause the platinum layer 30 to react with the polysilicon of the underlying polysilicon region 24b to form regions of platinum silicide which include the platinum silicide layer region 30b on the polysilicon region 24b as shown in FIG. 2B. In this instance, those portions of the platinum layer which overlie the second protective oxide layer 28 are not converted into silicide. The unreacted platinum layer on the second protective oxide layer 28 is removed by etching the layer. The platinum silicide layer region 30b thus formed is extremely thin and is lacking in uniformity of chemical composition and, for this reason, tends to cause contact failures during subsequent process steps or during use of the device as previously noted. Titanium-tungsten alloy is then deposited using sputtering techniques on the entire surface of the resultant structure to form a titanium-tungsten layer to a thickness of, for example, about 1000 Å. Thereupon, aluminum is deposited, also by sputtering, on the surface of the titanium-tungsten layer to form an aluminum layer to a thickness of, for example, about 1 micron on the titanium-tungsten layer. These titanium-tungsten and aluminum layers are patterned and etched to leave titanium-tungsten barrier regions including the layer region 32b on the platinum silicide layer region 30b and wiring electrode regions including the layer region 34b of aluminum on the titanium-tungsten barrier layer region 32b as shown in FIG. 2B.

The platinum silicide layer region 30b forming part of the contact system for the emitter region 26 is extremely thin and is lacking in uniformity of chemical composition as above noted. During the subsequent high-temperature steps of the fabrication and packaging process or during uses of the device completed, reaction proceeds between the titanium-tungsten alloy of the barrier layer and the polysilicon in the doped polysilicon region 24b through a locally thinned or degraded portion of the platinum silicide layer region 30b and forms a new silicide such as tungsten silicide. The titanium-tungsten barrier layer per se serves as an excellent barrier to the aluminum layer but, once the tungsten silicide is formed through the platinum silicide layer, aluminum atoms in the overlying wiring electrode layer region 34b are allowed to diffuse through the tungsten silicide region and are enabled to react vitally with the polysilicon in the polysilicon region 24b. The reaction of aluminum atoms with the polysilicon may propagate through the emitter region 26 far into the base region 20 of the substrate 10. Penetration of such reaction across the p-n junction interface between the base and emitter regions 20 and 26 causes an aluminum spike as indicated at 36 in FIG. 2C. Formation of such an aluminum spike is serious especially for the emitter region 26 forming a shallow p-n junction with the base region 20 and will invite a complete failure of the device during the subsequent process steps or during use of the device as previously noted. This problem is encountered not only by semiconductor devices using Al/Ti-W/PtSi contact systems but also by those using other types of multilayer contact systems including a layer of a metal silicide and a layer of aluminum.

It is, accordingly, an important object of the present invention to provide an improved semiconductor device featuring an electrical multilayer contact system which remains in a stable state during the various steps, especially the high-temperature steps, of the device fabrication and packaging process subsequent to formation of the contact system and further throughout the use of the device fabricated.

It is another important object of the present invention to provide a process of fabricating such an improved semiconductor device.

SUMMARY OF THE INVENTION

In accordance with the present invention, there is provided a semiconductor device having a semiconductor layer of a predetermined conductivity type heavily doped to a predetermined dopant concentration and a multilayer contact system in contact with a surface portion of the heavily doped semiconductor layer, the multilayer contact system comprising (a) a metal silicide layer of the silicide of a refractory metal, the metal silicide layer directly contacting the surface portion of the heavily doped semiconductor layer and being lower in dopant concentration than the predetermined dopant concentration of the semiconductor layer, (b) a barrier layer of at least one metal on the metal silicide layer, and (c) an electrode layer including a highly conductive metal on the barrier layer.

In accordance with another outstanding aspect of the present invention, there is provided a process of fabricating a semiconductor device, comprising (a) preparing a semiconductor substrate, (b) forming a first silicon layer of a predetermined conductivity type heavily doped to a predetermined dopant concentration, (c) forming a second silicon layer on the first silicon layer, the second silicon layer being substantially free from dopant, (d) forming a layer of a refractory metal on the second silicon layer, (e) causing the refractory metal layer and the second silicon layer to react with each other by heat treatment for thereby forming a metal silicide layer of the silicide of the refractory metal, (f) forming a barrier layer of at least one metal on the metal silicide layer, and (g) forming an electrode layer including a highly conductive metal on the barrier layer.

The predetermined dopant concentration of the heavily doped semiconductor layer, viz., the first silicon layer is preferably higher than about $1\times 10^{19}$ atoms/cm$^3$ and the metal silicide layer has resulted from the reaction between a silicon layer substantially free from dopant and a layer of the refractory metal. In this instance, the metal silicide layer, viz., the second silicon layer preferably contains a dopant in a concentration less than $1\times 10^{17}$ atoms/cm$^3$. The conductivity type of the second silicon layer is typically identical with the conductivity type of the first silicon layer. If desired, however, the second silicon layer may be converted into the metal silicide layer, in which instance the conductivity type of the second silicon layer may be opposite to the conductivity type of the first silicon layer. On the other hand, the thickness of the metal silicide layer is defined by the thickness of the substantially nondoped second silicon layer with the reaction of the refractory metal layer and the silicon layer performed within the second silicon layer and precluded from propagating into the polysilicon layer. It therefore follows that the uniformity of composition of the metal silicide layer can be maintained by virtue of the second silicon layer. This is because of the fact that the silicidizing reaction proceeds more effectively in a lightly-doped region than in a heavily-doped region. Considering that the silicidizing reaction thus proceeds in the second silicon layer and substantially not in the first silicon layer, it is important that the first silicon layer be as thick as 300 Å or more and, on the other hand, the second silicon layer be as thick as 1000 Å or less in order that the second silicon layer can be totally silicidized and be free from any light-doped portion which has failed to be silicidized. If it is desired that the metal silicide layer be formed by introduction of the dopant from the emitter region and the first silicon layer, heat treatment at, for example, 1000° C. should thus be performed to form these regions after the first silicon layer has been formed by step (b) in a process according to the present invention. This step (b) is followed by the step (c) to form the second silicon layer. If the above mentioned heat treatment is performed after the second silicon layer has been formed, the dopant in the first silicon layer would migrate up into the second silicon layer and would thus add to the dopant concentration of the second silicon layer. The use of the temperature of 500° C. for the silicidization reaction is conducive to avoiding such an inconvenience. Thus the metal silicide layer of a semiconductor device according to the present invention preferably has a thickness ranging from about 300 Å to about 2000 Å.

BRIEF DESCRIPTION OF THE DRAWINGS

The features and advantages of a semiconductor device according to the present invention and further details of a process of fabricating such a semiconductor device in accordance with the present invention will be more clearly understood from the following description taken in conjunction with the accompanying drawings in which like reference numerals designate similar or corresponding elements, regions and portions and in which.

DESCRIPTION OF THE PREFERRED EMBODIMENT

Figure 3:
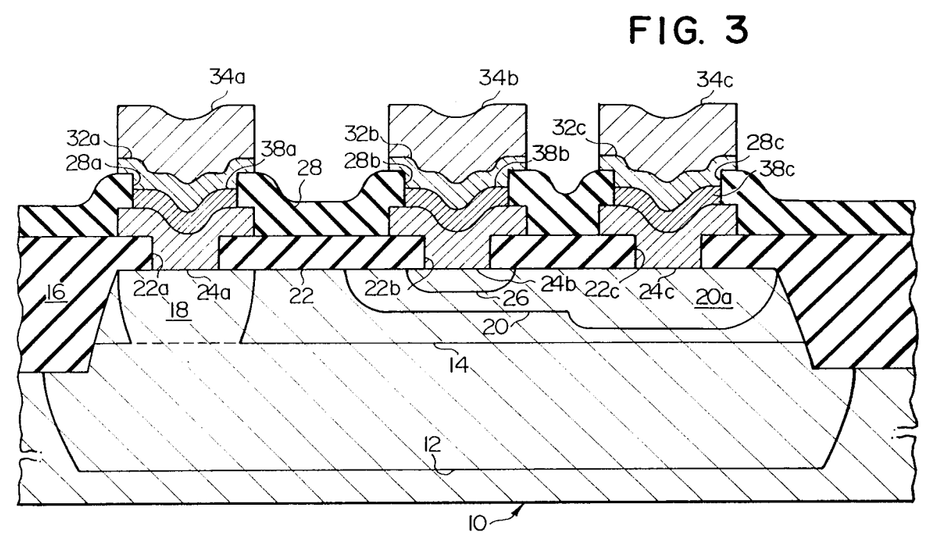
FIG. 3 is a fragmentary cross sectional view showing a preferred embodiment of a semiconductor device according to the present invention.

Referring to FIG. 3 of the drawings, a semiconductor device embodying the present invention comprises a substrate 10 which per se is essentially similar to its counterpart in the prior-art semiconductor device described with reference to FIG. 1. The silicon substrate 10 herein shown thus also has a buried n+-type diffusion region 12, and an n-type layer 14 epitaxially grown in the n+-type diffusion region 12. In the n-type epitaxial layer 14 are selectively formed an isolation oxide layer 16 and an n+-type collector contact region 18 homogeneous with the buried n+-type diffusion region 12. Within the island of the epitaxial layer 14 is further formed a p-type base region 20 having a heavily doped graft base area 20a.

On the entire surface of the resultant structure is provided a relatively thin first protective layer 22 of silicon oxide which is formed with openings 22a, 22b and 22c. Polysilicon regions 24a, 24b and 24c are formed each in part contacting the silicon substrate 10 through each of the openings 22a, 22b and 22c, respectively, in the oxide layer 22 and in part overlying edge portions of the oxide layer 22 along each opening. Similarly to the polysilicon regions provided in the prior-art semiconductor device shown in FIG. 1, each of the regions 24a, 24b and 24c thus left of the polysilicon layer is assumed to have overlaps of about 1 micron with the edge portion of the oxide layer 22 along each of the openings 22a, 22b and 22c in the layer 22. As will be described in more detail, each of the polysilicon regions 24a and 24b is heavily doped with an n-type dopant such as arsenic and the polysilicon region 24c is doped with a p-type dopant such as boron. The entire structure is heated to anneal the doped polysilicon regions 24a, 24b and 24c to form an n-type emitter region 26 within the base region 20, as also noted previously.

A second protective layer 28 of silicon oxide is formed on the entire surface of the resultant structure and is patterned and etched to form contact openings 28a, 28b and 28c over the doped polysilicon regions 24a, 24b and 24c, respectively. Through these contact openings 28a, 28b and 28c in the second protective oxide layer 28 is formed a multilayer contact system which comprises a metal silicide layer of the silicide of a refractory metal such as platinum directly contacting a surface portion of the heavily doped polysilicon layer 24a/24b/24c, a barrier layer (32) of at least one refractory metal such as titanium-tungsten alloy on the metal silicide layer, and a toplevel wiring electrode layer including a highly conductive metal such as aluminum on the barrier layer.

A layer of platinum is thus deposited on the entire upper surfaces of the doped polysilicon regions 24a, 24b and 24c and the second protective oxide layer 28, whereupon heat treatment is used at 500° C. to form platinum silicide layer regions now denoted by 38a, 38b and 38c on the exposed upper surfaces of the doped polysilicon regions 24a, 24b and 24c, respectively, within the openings 25a, 25b and 25c, respectively, in the second protective oxide layer 28. The platinum layer remaining on the protective oxide layer 28 is removed before the barrier and wiring electrode layers are to be formed. After the barrier and wiring electrode layers are formed conformally on the surface of the resultant structure, the layers are patterned to leave titanium-tungsten barrier layer regions 32a, 32b and 32c on the platinum silicide layer regions 38a, 38b and 38c, respectively, and wiring electrode layer regions 34a, 34b and 34c of aluminum on the titanium-tungsten barrier layer regions 32a, 32b and 32c, respectively. In the semiconductor device embodying the present invention, the platinum silicide layer regions 38a, 38b and 38c in the contact openings 28a, 28b and 28c, respectively, are commonly of a thickness of about 600 Å in contrast to the 300 Å thick platinum silicide layer regions 30a, 30b and 30c in the prior-art semiconductor device shown in FIG. 1.

A process of fabricating the semiconductor device thus constructed in accordance with the present invention will be hereinafter described with reference to FIGS. 4A to 4D which show some structures formed during the fabrication process. In these FIGS. 4A to 4D are shown, also for simplicity of illustration, only those portions of the semiconductor device shown in FIG. 3 which are associated with the electrode stack for the emitter region 26 of the device.

Figure 4A:
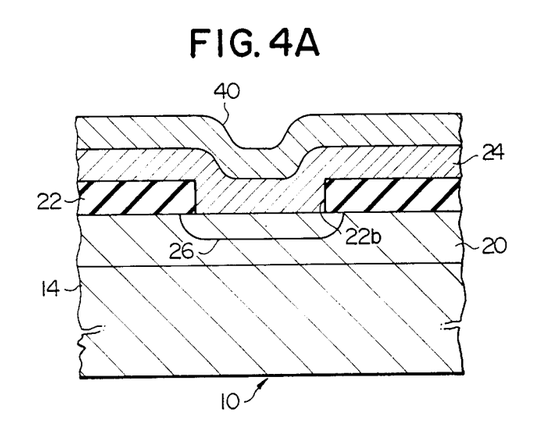
FIGS. 4A to 4D are fragmentary cross sectional views showing some structures formed during the process of fabricating the semiconductor device of FIG. 3 in accordance with the present invention.

Referring to FIG. 4A, the silicon substrate 10 has the n-type layer 14 which has been epitaxially grown in the buried n+-type diffusion region 12 (FIG. 3) of the substrate 10. In this n-type epitaxial layer 14 is locally formed the p-type base region 20 which is covered with the first protective layer 22 of silicon oxide formed with the opening 22b allowing the surface of the silicon substrate 10 to partly expose therethrough. Polysilicon is then conformally deposited over the entire surface of the resultant structure to form a first polysilicon layer 24 in part on the surface of the first protective oxide layer 22 and in part on the silicon substrate 10 through the opening 22b in the oxide layer 22. The polysilicon layer 24 has its regions over the region 26 then heavily doped with an n-type dopant such as arsenic preferably by ion implantation techniques with a dosage of $1\times10^{16}$ atoms/cm$^2$. The entire structure is then heated at, for example, 950° C. for 15 minutes to anneal the polysilicon region 24b, with the result that the n-type dopant in the polysilicon layer 24 is caused to partially diffuse into the p-type base region 20 to form the shallow n-type emitter region 26 within the base region 20. As a result of this annealing step, improved ohmic contact is provided the emitter region 26 and the associated polysilicon layer 24. It may be herein noted that the ion implant of arsenic with the dosage of $1\times10^{16}$ atoms/cm$^2$ into the polysilicon layer 24 results in a dopant density of up to about $1\times10^{20}$ atoms/cm$^3$ to about $1\times10^{21}$ atoms/cm$^3$ in the direction of depth of the substrate 10. The dosage used for the ion implant of the n-type dopant for the formation of the doped polysilicon layer 24 is preferably selected to provide a dopant density higher than about $1\times10^{19}$ atoms/cm$^3$ in the layer 24.

Figure 4B:
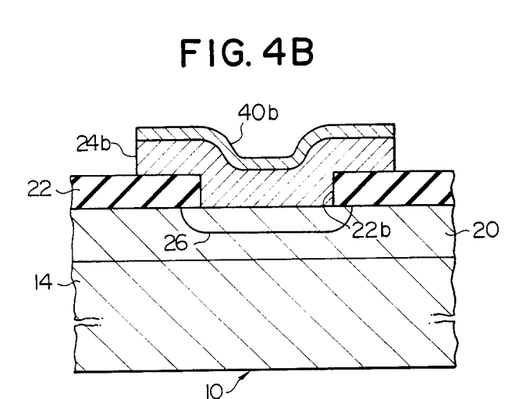

Thereafter, polysilicon is further conformally deposited to form a non-doped or lightly-doped second polysilicon layer 40 to a thickness of about 300 Å to about 1000 Å over the entire surface of the doped first polysilicon layer 24 as shown in FIG. 4A. The term "non-doped" as herein mentioned in regard to the second polysilicon layer 40 means that the polysilicon forming the layer 40 contains the dopant in a concentration preferably less than about $1\times10^{17}$ atoms/cm$^3$. The first and second polysilicon layers 24 and 40 are then patterned and etched away to leave doped polysilicon regions including the region 24b in part contacting the silicon substrate 10 through the opening 22b in the oxide layer 22 and in part overlying edge portions of the oxide layer 22 along the opening 22b and non-doped polysilicon regions including a region 40b coextensively overlying the doped polysilicon region 24b as shown in FIG. 4B. The coextensive regions 24b and 40b thus left of the first and second polysilicon layers 24 and 40 correspond to the partly doped and partly non-doped polysilicon region 24b in the device shown in FIG. 3 and have overlaps of about 1 micron with the edge portions of the oxide layer 22 along the opening 22b in the layer 22.

As will be readily understood, doped polysilicon regions corresponding to the region 24b of the first polysilicon layer 24 and non-doped polysilicon regions corresponding to the region 40b of the second polysilicon layer 40 are also formed on the collector and base regions 18 and 20, respectively, of the silicon substrate 10 shown in FIG. 3. The doped polysilicon region of the first polysilicon layer 24 as formed in association with the collector contact region 18 is doped with an n-type dopant such as arsenic and the doped polysilicon region of the first polysilicon layer 24 as formed in association with the base region 20 is doped with a p-type dopant such as boron. The coextensive regions of the first and second polysilicon layers 24 and 40 as formed in association with the collector and base regions 18 and 20, respectively, of the silicon substrate 10 also have overlaps of about 1 micron with the edge portions of the oxide layer 22 along the openings 22a and 22c, respectively, in the layer 22. The annealing step performed as previously noted also provides improved ohmic contact between the collector contact region 18 and the associated polysilicon region 24a and between the graft base area 20a of the base region 20 and the associated polysilicon region 24c in the silicon substrate 10 shown in FIG. 3.

Figure 4C:
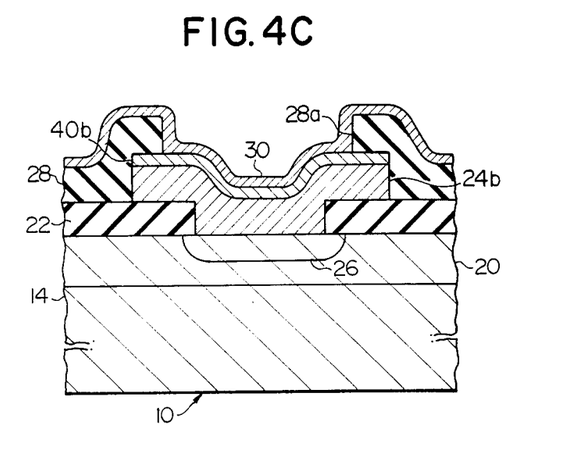
Figure 4D:
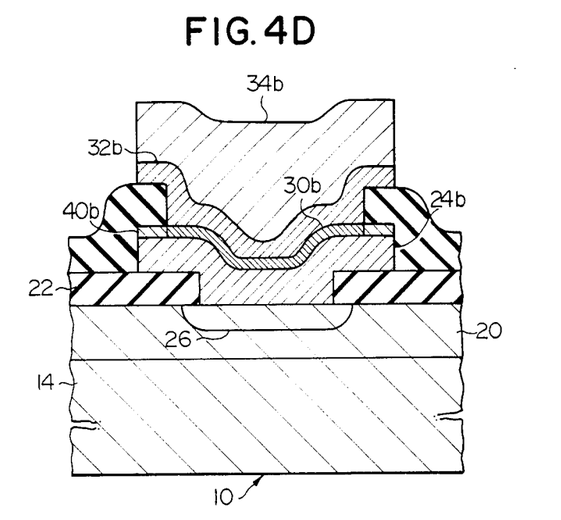

The second protective layer 28 of silicon oxide is then conformally deposited on the entire surface of the resultant structure and is patterned and etched to form contact openings including the contact opening 28b allowing the surface of the non-doped polysilicon region 40b over the emitter region 26 to partly expose as will be seen from FIG. 4C. Platinum is then conformally deposited by, for example, sputtering onto the entire surface of the structure to form a platinum layer 30 to a thickness of, for example, about 300 Å as shown in FIG. 4C. Heat treatment is then used at 500° C. for 15 minutes to cause the platinum layer 30 to react with the polysilicon of the underlying non-doped polysilicon region 40b, forming about 600 Å thick regions of platinum silicide which include the platinum silicide layer region 30b on the polysilicon region 40b. Titanium-tungsten alloy is then deposited preferably using sputtering techniques on the entire surface of the resultant structure to form a titanium-tungsten layer to a thickness of, for example, about 1000 Å. Thereupon, aluminum is deposited, also preferably by sputtering, on the surface of the titanium-tungsten layer to form an aluminum layer to a thickness of, for example, about 1 micron on the titanium-tungsten layer. These titanium-tungsten and aluminum layers are patterned and etched to leave titanium-tungsten barrier regions including the layer region 32b on the platinum silicide layer region 38b and wiring electrode regions including the layer region 34b of aluminum on the titanium-tungsten barrier layer region 32b as shown in FIG. 4D.

The platinum silicide regions 38a, 38b and 38c formed on the doped polysilicon regions 24a, 24b and 24c, respectively, of the multilayer contact system of the semiconductor device embodying the present invention as shown in FIG. 3 have resulted from the reaction of platinum with the fine polysilicon particles forming the non-doped polysilicon regions resulting from the second polysilicon layer 40. The reaction between the platinum and the polysilicon particles proceeds substantially throughout the thickness of the platinum layer and uniformly and reliably as if the reaction took place on a lightly doped silicon substrate. The platinum silicide region which forms part of the contact system of the semiconductor device embodying the present invention has an adequate thickness and adequate uniformity of chemical composition and will thus provide a significantly reduced contact resistance and a significantly increased resistance to heat.

Although the platinum silicide layer regions 38a, 38b and 38c of the multilayer electrode stacks of the semiconductor device embodying the present invention have been described to be formed to the thickness of about 600 Å, the thickness of these layer regions may be varied within an appropriate range depending upon the thickness of the non-doped second polysilicon layer 40 and the thickness of the platinum layer 30 to be deposited on the polysilicon layer 40 and/or the period of time for which the wafer is to be heated for the silicidization of the platinum layer.

While, on the other hand, it has been assumed that silicide of platinum is used for the metal silicide layer in the multilayer contact system of the described embodiment, the metal silicide to form part of the multilayer contact system of a semiconductor device according to the present invention may be selected from the group consisting of titanium silicide ($TiSi_2$), tantalum silicide ($TaSi_2$), molybdenum silicide ($MoSi_2$), tungsten silicide ($WSi_2$) and any other silicides of refractory metals. Furthermore, the non-doped polysilicon layer 40 to be used as a source of polysilicon for the silicidization of such a refractory metal may be formed by amorphous silicon or monocrystalline silicon rather than polysilicon. While this polysilicon layer is substantially free from dopant, viz., contains a dopant in a concentration less than $1 \times 10^{17}$ atoms/cm$^3$, the polysilicon layer to form the polysilicon regions 24a, 24b and 24c, viz., the heavily doped polysilicon layer in a semiconductor device according to the present invention may contain the dopant in a concentration preferably higher than about $1 \times 10^{19}$ atoms/cm$^3$. On the other hand, the barrier layer which has been assumed to be formed by a titanium-tungsten alloy may be constructed of a metal nitride such as titanium nitride (TiN) or tantalum nitride (TaN) or an alloy such as a titanium-tungsten alloy (Ti-W), a ferrotungsten alloy (Fe-W) or a nickel-niobium alloy (Ni-Nb).

The thickness of the non-doped second polysilicon layer 40 has been specified to be about 300 Å but may be increased up to about 2000 Å in view of the upper limit of 1000 Å of the thickness of the platinum layer 30. A thickness higher than this upper limit would result in inability of the non-doped polysilicon layer to be reacted by platinum or another refractory metal throughout the thickness of the polysilicon layer and would accordingly give rise to a critical increase in the contact resistance available. The lower limit of the thickness of the non-doped polysilicon layer is dictated by the quantity of silicon required for the silicidization of the selected refractory metal throughout the thickness of the layer of the refractory metal and is, thus, dependent on the selected thickness of the layer of the refractory metal deposited. Where platinum is used as the refractory metal to be silicidized as in the described embodiment, the thickness of the non-doped polysilicon layer to be deposited should thus be less than about 300 Å in view of the thickness of about 300 Å to which the platinum layer 30 is deposited in the process described with reference to FIGS. 4A to 4D. If the non-doped polysilicon layer is deposited to a thickness less than about 300 Å, then the platinum layer 30 overlying the polysilicon layer would be unable to thoroughly react with polysilicon. In this instance, the platinum remaining unreacted would be allowed to react with the bulk of the silicon substrate 10 doped with different kinds of dopant to different densities and would fail to assure the platinum silicide layer to provide proper uniformity of chemical composition.

What is claimed is:

1. A process of fabricating a semiconductor device, comprising
   (a) forming a heavily doped first semiconductor layer of a first conductivity type,
   (b) forming a first protective layer of an insulating material on said first semiconductor layer and having an opening allowing a portion of the first semiconductor layer to be exposed therethrough,
   (c) forming a second silicon layer partly on said first protective layer and partly on said portion of said first semiconductor layer,
   (d) heavily doping said second silicon layer with a dopant of a second conductivity type opposite to said first conductivity type and thereafter annealing the doped second silicon layer to form in said first semiconductor layer an active region of said second conductivity type substantially aligned with said opening with enhanced ohmic contact provided between said active region and said second silicon layer,
   (e) forming a substantially non-doped third silicon layer on said second silicon layer,
   (f) forming a second protective layer of an insulating material on said third silicon layer and having an opening allowing a portion of the third semiconductor layer to be exposed therethrough, the opening in the second protective layer being substantially aligned with the opening in said first protective layer across said second and third silicon layers,
   (g) forming a layer of a refractory metal partly on said second protective layer and partly on said portion of said third silicon layer,
   (h) heating the resultant structure to cause the refractory metal layer and the third silicon layer to react with each other for thereby forming a metal silicide layer of the refractory metal silicide,
   (i) forming a barrier layer of at least one metal on said metal silicide layer, and
   (j) forming an electrode layer including a highly conductive metal on said barrier layer.

2. A process of fabricating a semiconductor device, comprising
   (a) forming a heavily doped first silicon layer of a first conductivity type,
   (b) forming a first silicon oxide layer on said silicon layer and having an opening allowing a portion of the silicon layer to be exposed therethrough,
   (c) forming a first polysilicon layer partly on said first silicon oxide layer and partly on said portion of said first silicon layer,
   (d) heavily doping said first polysilicon layer with a dopant of a second conductivity type opposite to said first conductivity type and thereafter annealing the doped first polysilicon layer to form in said first silicon layer an active region of said second conductivity type substantially aligned with said opening with enhanced ohmic contact provided between said active region and said first polysilicon layer,
   (e) forming a substantially non-doped second polysilicon layer on said first polysilicon layer,
   (f) forming a second silicon oxide layer on said second polysilicon layer and having an opening allowing a portion of the second polysilicon layer to be exposed therethrough, the opening in the second silicon oxide layer being substantially aligned with the opening in said first silicon oxide layer across said second and second polysilicon layers,
   (g) forming a layer of a refractory metal partly on said second silicon oxide layer and partly on said portion of said second polysilicon layer,
   (h) heating the resultant structure to cause the refractory metal layer and the second polysilicon layer to react with each other for thereby forming a metal silicide layer of the refractory metal silicide,
   (i) forming a barrier layer of at least one metal on said metal silicide layer, and
   (j) forming an electrode layer including a highly conductive metal on said barrier layer.

3. A process of fabricating a semiconductor device, comprising
   (a) forming a heavily doped first silicon layer of a first conductivity type,
   (b) forming a first silicon oxide layer on said silicon layer and having an opening allowing a portion of the silicon layer to be exposed therethrough,
   (c) forming a first polysilicon layer partly on said first silicon oxide layer and partly on said portion of said first silicon layer,
   (d) doping said first polysilicon layer with a dopant of a second conductivity type opposite to said first conductivity type to a dopant density higher than $1 \times 10^{19}$ atoms/cm$^2$,
   (e) thereafter annealing the doped first polysilicon layer to form in said first silicon layer an active region of said second conductivity type substantially aligned with said opening with enhanced ohmic contact provided between said active region and said first polysilicon layer,
   (f) forming a second polysilicon layer on said first polysilicon layer to a thickness within a range of from about 300 Å to about 100 Å, said second polysilicon layer containing impurities in a concentration less than $1 \times 10^{17}$ atoms/cm$^3$,
   (g) forming a second silicon oxide layer on said second polysilicon layer and having an opening allowing a portion of the second polysilicon layer to be exposed therethrough, the opening in the second silicon oxide layer being substantially aligned with the opening in said first silicon oxide layer across said second and second polysilicon layers,
   (h) forming a layer of a refractory metal partly on said second silicon oxide layer and partly on said portion of said second polysilicon layer,
   (i) heating the resultant structure to cause the refractory metal layer and the second polysilicon layer to react with each other for thereby forming a metal silicide layer of the refractory metal silicide, (j) forming a barrier layer of at least one metal on said metal silicide layer, and (k) forming an electrode layer including a highly conductive metal on said barrier layer.

4. A process as set forth in claim 3, in which said first polysilicon layer is doped with said dopant with a dosage selected to provide a dopant density of a range of from about $1 \times 10^{19}$ atoms/cm$^3$ to about $1 \times 10^{21}$ atoms/cm$^3$.

* * * * *